(12) United States Patent
Niki et al.

(10) Patent No.: US 11,081,175 B2
(45) Date of Patent: Aug. 3, 2021

(54) SEMICONDUCTOR DEVICE AND MEMORY DEVICE

(71) Applicant: KIOXIA CORPORATION, Tokyo (JP)

(72) Inventors: Yusuke Niki, Yokohama Kanagawa (JP); Atsushi Kawasumi, Fujisawa Kanagawa (JP); Takayuki Miyazaki, Tokyo (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/943,638

(22) Filed: Jul. 30, 2020

(65) Prior Publication Data

US 2021/0090650 A1 Mar. 25, 2021

(30) Foreign Application Priority Data

Sep. 20, 2019 (JP) .............................. JP2019-171081

(51) Int. Cl.
*G11C 13/00* (2006.01)
*H01L 45/00* (2006.01)

(52) U.S. Cl.
CPC .......... *G11C 13/0021* (2013.01); *H01L 45/06* (2013.01); *H01L 45/12* (2013.01)

(58) Field of Classification Search
CPC ...... G11C 13/0021; H01L 45/06; H01L 45/12
USPC ........................................... 365/148, 189.15
See application file for complete search history.

(56) References Cited

U.S. PATENT DOCUMENTS

| 5,550,528 | A | * | 8/1996 | Offord | G06F 7/02 340/146.2 |
| 6,356,987 | B1 | * | 3/2002 | Aulas | G06F 13/4243 711/167 |
| 6,812,874 | B1 | * | 11/2004 | Johnson | H03M 1/001 341/110 |
| 6,946,867 | B2 | | 9/2005 | Naganawa | |
| 7,447,254 | B1 | * | 11/2008 | Mack | H04J 13/0022 375/143 |
| 8,458,501 | B2 | * | 6/2013 | Bose | G06F 1/3206 713/320 |
| 8,929,490 | B1 | * | 1/2015 | Fernandes Barros | H04W 4/80 375/343 |

(Continued)

FOREIGN PATENT DOCUMENTS

| JP | 2004-080553 A | 3/2004 |
| JP | 2014-170605 A | 9/2014 |
| JP | 2015-056199 A | 3/2015 |

*Primary Examiner* — Michael T Tran
(74) *Attorney, Agent, or Firm* — Foley & Lardner LLP

(57) ABSTRACT

According to one embodiment, a device includes first lines transmitting a first signals; second lines receiving the first signals; and a first circuit including a first selector coupled to the first lines, a second selector coupled to the second lines, third lines and a fourth lines between the first and second selectors. Each of the third lines stores the second signals, each of the fourth lines stores the third signals. The first circuit counts a first number of second signals equivalent to the corresponding first signal; counts a second number of third signals equivalent to corresponding first signal of the first signals; and couples either the third or the fourth lines to the first and second lines via the first and second selectors, based on a result of comparison between the first and the second numbers.

20 Claims, 12 Drawing Sheets

(56) References Cited

U.S. PATENT DOCUMENTS

| | | | |
|---|---|---|---|
| 2007/0047680 A1* | 3/2007 | Okamura | H04L 25/03885 375/348 |
| 2011/0066798 A1* | 3/2011 | Kaiwa | G11C 11/40626 711/106 |
| 2012/0213021 A1* | 8/2012 | Riho | G11C 29/808 365/200 |
| 2015/0078102 A1 | 3/2015 | Yasufuku | |
| 2017/0220266 A1* | 8/2017 | Ahmad | G11C 7/1006 |
| 2018/0164370 A1* | 6/2018 | Kumar | G11C 15/00 |
| 2018/0204131 A1* | 7/2018 | Najafi | G06N 7/005 |
| 2018/0373248 A1* | 12/2018 | Chornenky | G06F 3/0604 |
| 2019/0128960 A1* | 5/2019 | Kumar | G11C 29/20 |
| 2020/0005885 A1* | 1/2020 | Mohr | G11C 29/56008 |
| 2020/0135263 A1* | 4/2020 | Brown | G11C 11/40622 |
| 2020/0394017 A1* | 12/2020 | Fritz | G06F 7/607 |

\* cited by examiner

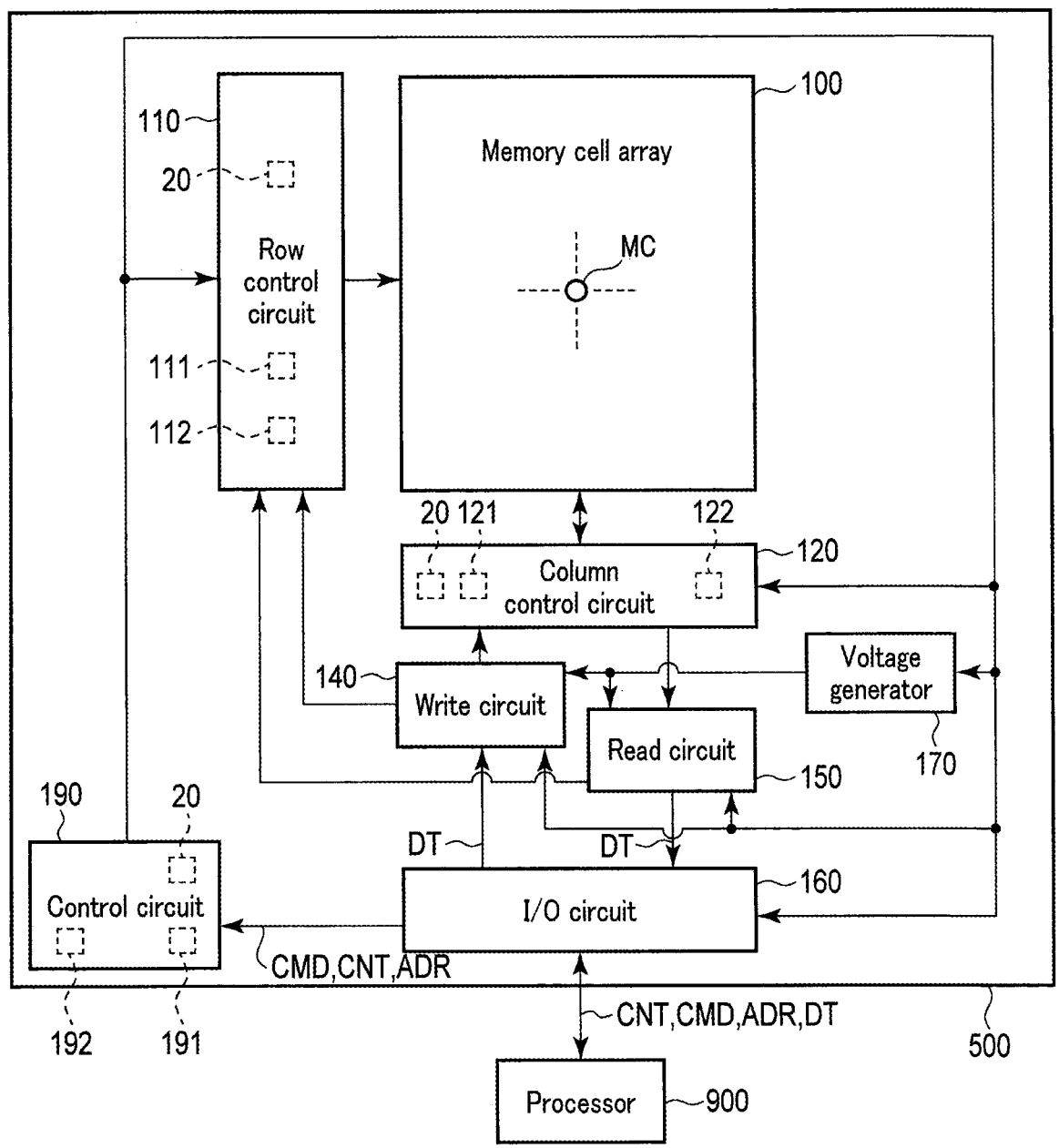
F I G. 1

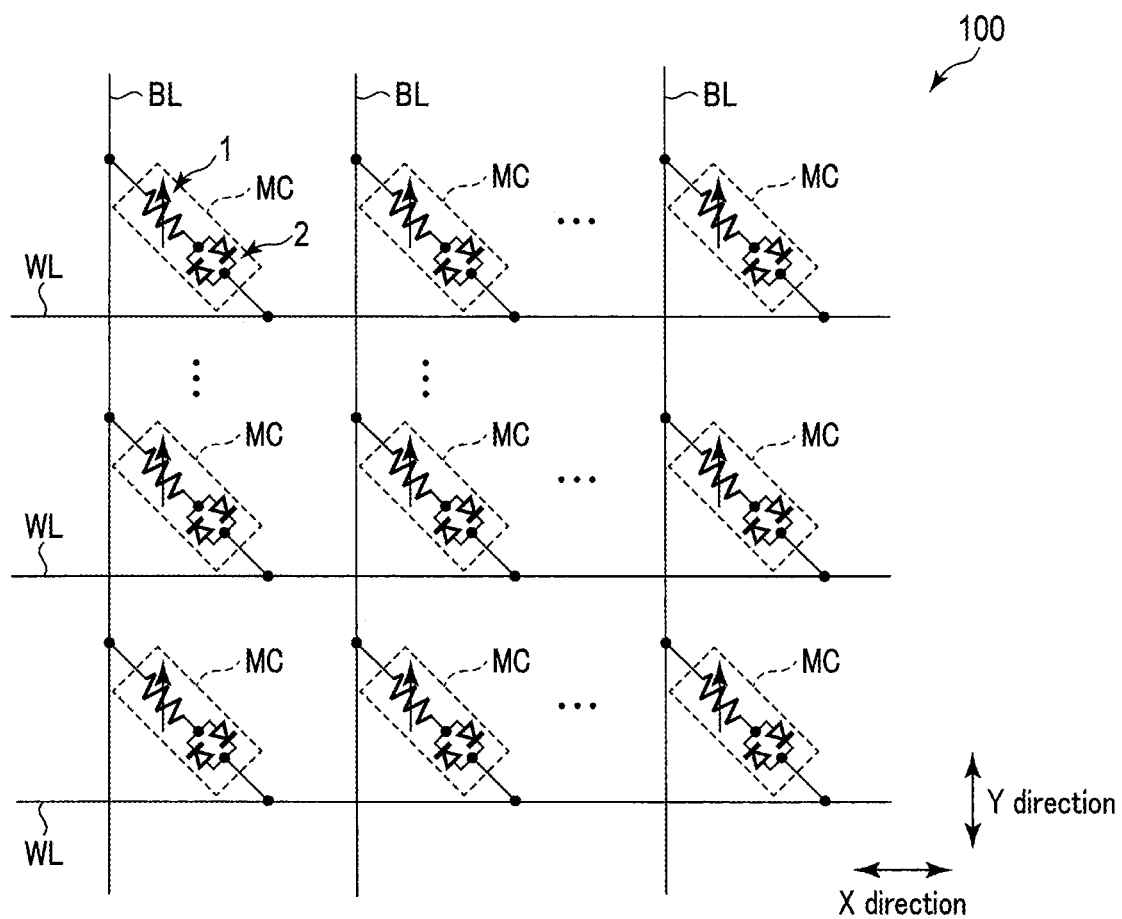
F I G. 2

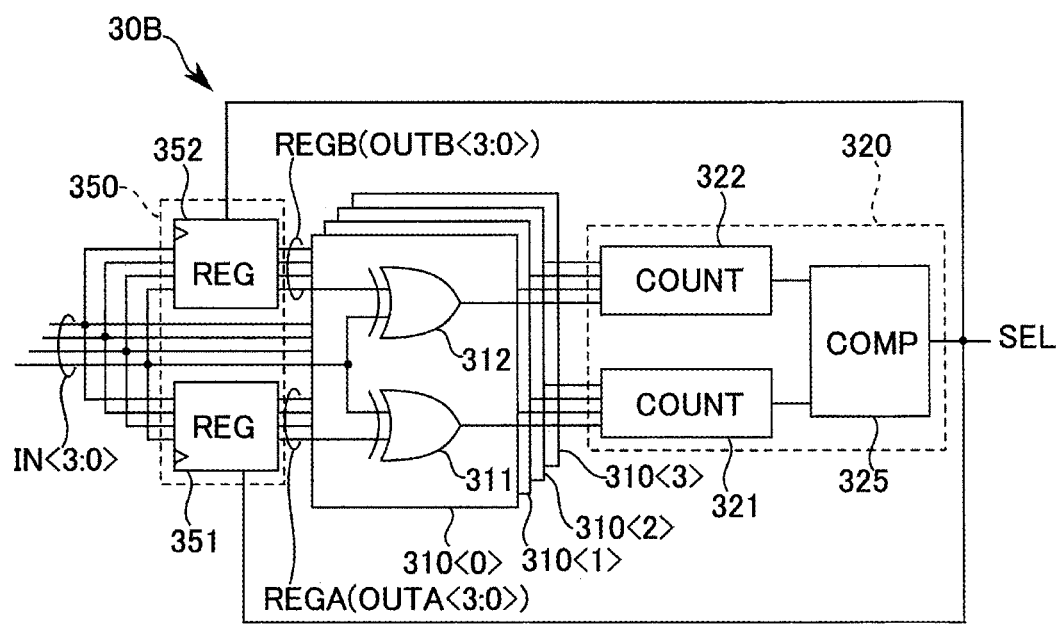
F I G. 12

SEMICONDUCTOR DEVICE AND MEMORY DEVICE

CROSS-REFERENCE TO RELATED APPLICATIONS

This application is based upon and claims the benefit of priority from Japanese Patent Application No. 2019-171081, filed Sep. 20, 2019, the entire contents of which are incorporated herein by reference.

FIELD

Embodiments described herein relate generally to a semiconductor device and a memory device.

BACKGROUND

When a signal is transferred in a semiconductor device, a bus that couples circuits is charged or discharged according to a signal level of the signal being transferred.

BRIEF DESCRIPTION OF THE DRAWINGS

FIG. 1 is a diagram showing a configuration example of a semiconductor device according to a first embodiment.

FIG. 2 is a diagram showing an example of an internal configuration of the semiconductor device according to the first embodiment.

FIGS. 11 and 12 are diagrams showing configuration examples of a semiconductor device according to a third embodiment.

DETAILED DESCRIPTION

Figure 3:
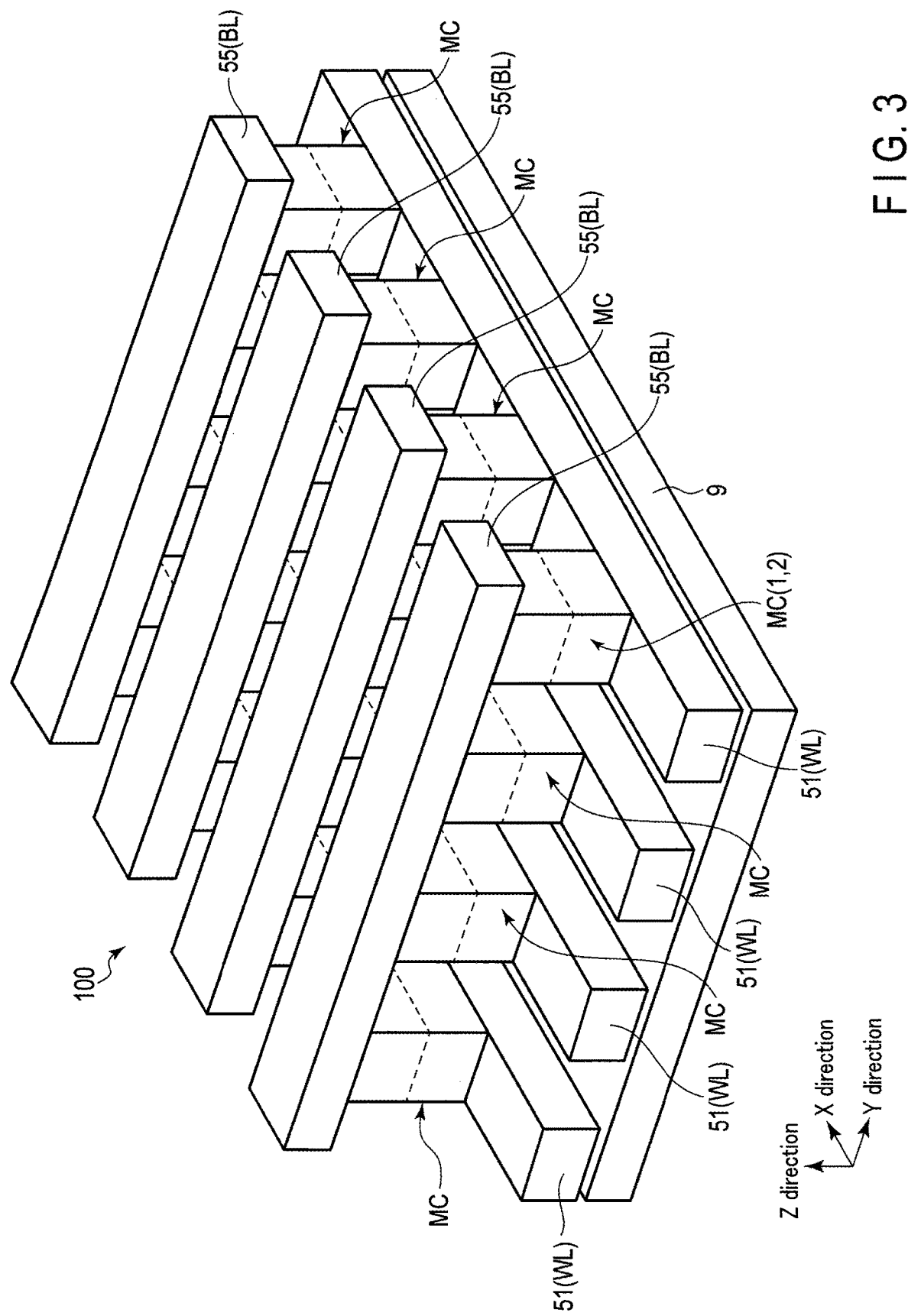
FIGS. 3 and 4 are diagrams showing examples of an internal configuration of the semiconductor device according to the first embodiment.

A semiconductor device according to an embodiment will be described with reference to FIGS. 1 to 12.

Hereinafter, the present embodiment will be described in detail with reference to the drawings. In the description that follows, components having the same functions and configurations will be denoted by the same reference symbols.

In the embodiments to be described below, when structural components (e.g., circuits, interconnects, voltages and signals of various types, etc.) assigned with reference symbols accompanied by a numeral/symbol for distinction need not be distinguished from one another, reference symbols are used without the accompanying numeral/symbol.

In general, according to one embodiment, a semiconductor device includes first signal lines that transmit first signals; second signal lines that receive the first signals; and a first circuit including a first selector circuit, a second selector circuit, third signal lines, and fourth signal lines, the first selector circuit being coupled to the first signal lines, the second selector circuit being coupled to the second signal lines, the third signal lines being coupled between the first and second selector circuits, and the fourth signal lines being coupled between the first and second selector circuits, wherein each of the third signal lines stores a corresponding one of the second signals, and each of the fourth signal lines stores a corresponding one of the third signals, the first circuit is configured to: count a first number of second signals equivalent to corresponding first signal of the first signals, with respect to the first and third signal lines; count a second number of third signals equivalent to the corresponding first signal, with respect to the first and fourth signal lines; and electrically couple either the third signal lines or the fourth signal lines to the first and second signal lines via the first and second selector circuits, based on a result of comparison between the first number and the second number.

(1) First Embodiment

A semiconductor device according to a first embodiment will be described with reference to FIGS. 1 to 8.

(a) Configuration Example

A configuration example of the semiconductor device according to the present embodiment will be described with reference to FIGS. 1 to 6.

FIG. 1 is a block diagram showing a configuration example of a semiconductor device according to the present embodiment.

A semiconductor device 1 according to the present embodiment is, for example, a memory device. However, the semiconductor device of the present embodiment is not limited to a memory device.

As shown in FIG. 1, the memory device 1 includes a memory cell array 100, a row control circuit 110, a column control circuit 120, a write circuit 140, a read circuit 150, an input/output (I/O) circuit 160, a voltage generator 170, and a control circuit 190.

The memory cell array 100 includes a plurality of memory cells MC and a plurality of interconnects. The memory cells MC are coupled to the corresponding interconnects.

The row control circuit 110 controls multiple rows of the memory cell array 100. The row control circuit 110 is supplied with a decoded result of an address (i.e., a row address). The row control circuit 110 sets a row (e.g., a word line) corresponding to the decoded result of the address to a selected state. Hereinafter, the row (or word line) set to the selected state will be referred to as a "selected row" (or a "selected word line"). The rows other than the selected row will be referred to as "non-selected rows" (or "non-selected word lines").

The row control circuit 110 includes, for example, a multiplexer (word line selection circuit) 111, a word line driver 112, etc.

The column control circuit 120 controls multiple columns of the memory cell array 100. The column control circuit 120 is supplied with a decoded result of an address (i.e., a column address) from the control circuit 190. The column control circuit 120 sets a column corresponding to the decoded result of the address (e.g., at least one bit line) to a selected state. Hereinafter, a column (or a bit line) set to a selected state will be referred to as a selected column (or a selected bit line). The columns other than the selected column will be referred to as "non-selected columns" (or "non-selected bit lines").

The column control circuit 120 includes a multiplexer (bit line selection circuit) 121, a bit line driver 122, etc.

The write circuit (also referred to as a write control circuit or a write driver) 140 performs various types of control for a write operation (data writing). During a write operation, the write circuit 140 supplies a write pulse formed by a current and/or a voltage to a memory cell MC via the row control circuit 110 and the column control circuit 120. Thereby, data is written into the memory cell MC.

The write circuit 140 includes, for example, a voltage source and/or a current source, a latch circuit, etc.

The read circuit (also referred to as a read control circuit or a read driver) 150 performs various types of control for a read operation (data reading). During a read operation, the read circuit 150 supplies a read pulse (e.g., a read current) to a memory cell MC via the row control circuit 110 and the column control circuit 120. The read circuit 150 senses a potential or a current value of the bit line BL. Based on the result of the sensing, the data in the memory cell MC is read.

The read circuit 150 includes, for example, a voltage source and/or a current source, a latch circuit, a sense amplifier circuit, etc.

The write circuit 140 and the read circuit 150 are not limited to independent circuits. The write circuit and the read circuit include, for example, a common component that can be shared, and may be provided as an integral circuit in the semiconductor device 1.

The I/O circuit 160 is an interface circuit for transmitting and receiving various types of signals in the semiconductor device 1.

During a write operation, the I/O circuit 160 transfers, to the write circuit 140 as write data, data from a processor 900 of an external device (a controller or a host device). During a read operation, the I/O circuit 160 transfers, to the processor 900 as read data, the data output to the read circuit 150 from the memory cell array 100.

The I/O circuit 160 transfers an address ADR and a command CMD from the processor 900 to the control circuit 190. The I/O circuit 160 transmits and receives a variety of control signals CNT to and from the control circuit 190 and an external device.

The voltage generator 170 generates voltages for various types of operations of the memory cell array 100, using a power supply voltage provided by an external device. During a write operation, the voltage generator 170 outputs a variety of voltages generated for the write operation to the write circuit 140. During a read operation, the voltage generator 170 outputs a variety of voltages generated for the read operation to the read circuit 150.

The control circuit (also referred to as a "state machine", a "sequencer", or an "internal controller") 190 controls operations of the circuits in the memory device 1 based on the control signals CNT, the address ADR, and the command CMD.

The command CMD is, for example, a signal indicating an operation to be performed by the memory device 1. The address ADR is, for example, a signal indicating coordinates of at least one memory cell (hereinafter referred to as "selected cell") to be a target of operations in the memory cell array 100. The address ADR includes a row address and a column address of the selected cell. The control signal CNT is, for example, a signal for controlling the operation timing of an external device and a memory device 500 and the operation timing of the inside of the memory device 500.

The control circuit 190 includes, for example, a command decoder 191, an address decoder 192, a latch circuit, etc.

<Memory Cell Array>

FIG. 2 is an equivalent circuit diagram showing an example of a configuration of the memory cell array of the memory device.

In the memory cell array 100 of the memory device 1, multiple word lines WL are aligned in a Y direction, as shown in FIG. 2. The word lines WL extend along an X direction. In the memory cell array 100, multiple bit lines BL are aligned in the X direction. The bit lines BL extend along the Y direction.

Each memory cell MC is arranged at an intersection of a corresponding bit line BL and a corresponding word line WL. One end of the memory cell MC is coupled to the corresponding bit line BL, and the other end of the memory cell MC is coupled to the corresponding word line WL.

Multiple memory cells MC that are aligned in the X direction are coupled in common to a single word line WL. Multiple memory cells MC that are aligned in the Y direction are coupled in common to a single bit line BL.

In the present embodiment, when the memory device 1 is a phase change memory, for example, each memory cell MC includes a single phase change element (variable resistance element) 60 and a single switching element 62.

In the phase change memory, a phase change element 60 functions as a memory element of the memory cell MC. The state (phase) of a layer of the phase change element 60 is invertibly switched between crystalline and amorphous, in response to a write pulse that has been supplied. The conductivity (resistance value or impedance) of a layer in the phase change element 60 varies according to whether the layer is in the crystalline state or in the amorphous state.

The switching element 62 switches between on and off (selection and non-selection) of the memory cell MC.

The switching element 62 is set to an on state (low resistance state; conductive state) when a voltage equal to or greater than a threshold voltage for the switching element 62 is applied to the memory cell MC. The switching element 62 is set to an off state (high resistance state; non-conductive state) when a voltage lower than a threshold voltage for the switching element 62 is applied to the memory cell.

The switching element 62 in the on state allows a current to flow through the memory cell MC. In accordance with a potential difference between the bit line and the word line, the switching element 62 in the on state supplies a current flowing from the bit line side to the word line side or a current flowing from the word line side to the bit line side to the phase change element 60. The switching element 62 is an element that allows a current to bidirectionally flow through the phase change element 60. The switching element 62 functions as, for example, a bidirectional diode.

FIG. 3 is a bird's-eye view showing an example configuration of the memory cell array of the phase change memory according to the present embodiment.

As shown in FIG. 3, the memory cell array 100 includes a plurality of interconnects 51, a plurality of memory cells MC, and a plurality of interconnects 55.

The interconnects 51 extend along the X direction. The interconnects 51 are arranged in the Y direction.

The interconnects 55 extend along the Y direction. The interconnects 55 are arranged in the X direction. The interconnects 55 are provided above the interconnects 51 from a perspective of a Z direction.

The X direction is a direction parallel to a surface (top surface) of a substrate (insulating layer) 9. The Y direction is a direction parallel to the surface of the substrate 9 and intersecting (e.g., orthogonal to) the X direction. The Z direction is a direction perpendicular to a surface (X-Y plane) of the substrate 9.

Either the interconnects 51 or the interconnects 55 are word lines, and the other interconnects are bit lines. In the example of FIG. 3, the interconnects 51 are word lines WL, and the interconnects 55 are bit lines BL.

The memory cells MC are two-dimensionally arrayed on the X-Y plane of the memory cell array 100. The memory cells MC are provided between the interconnects 51 and the interconnects 55. The memory cells MC are stacked on the interconnects 51. The interconnects 55 are stacked on the memory cells MC.

The configuration of the memory cell array 100 is not limited to the example of FIG. 3.

For example, multiple memory cells MC may be arranged in the memory cell array 100 in the Z direction. In this case, memory cells MC adjacent to each other in the Z direction share an interconnect 55 (or an interconnect 51) in common. It is preferable, for example, that the phase change element 60 and the switching element 62 of one of two memory cells MC adjacent to each other in the Z direction are arranged in an order such that they form a mirror image of each other, with respect to the interconnect 55 shared in common.

Figure 4:
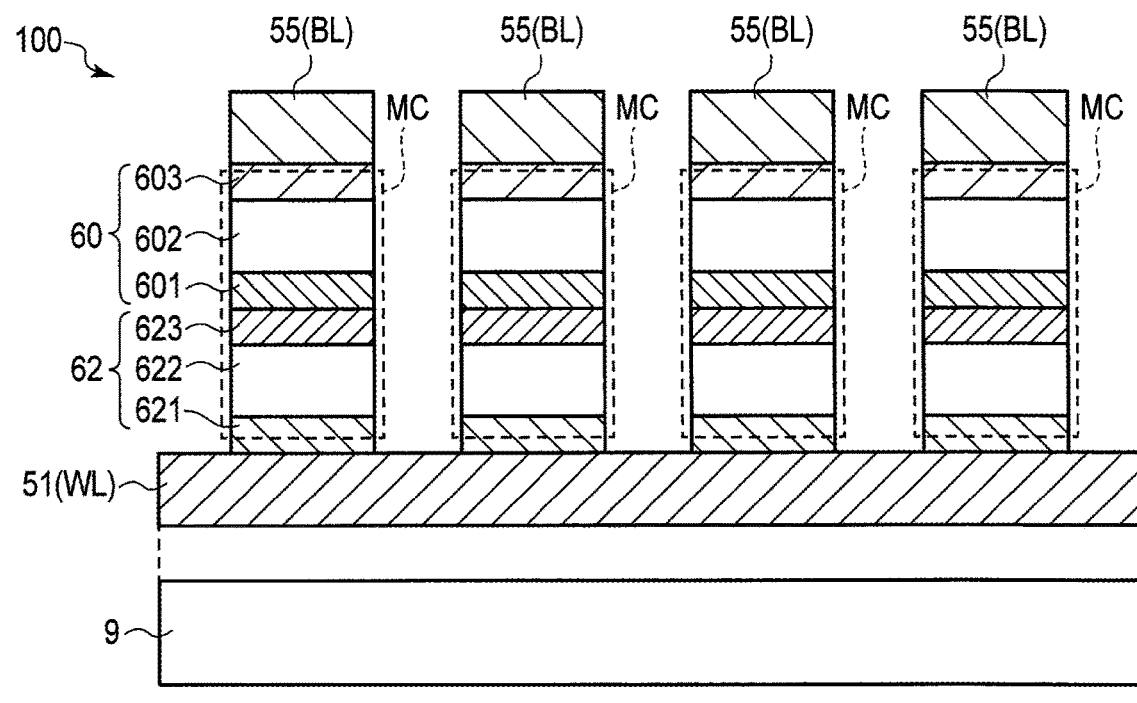

FIG. 4 shows a cross-sectional configuration of the memory cell array of the phase change memory according to the present embodiment. FIG. 4 shows a cross section (X-Z plane) of the memory cell array, taken along the X direction.

As shown in FIG. 4, a memory cell MC is a layer stack including a phase change element 60 and a switching element 62. The phase change element 60 is provided on the switching element 62 in the Z direction.

The switching element 62 is a variable resistance element including two terminals. The switching element 62 includes two electrodes (terminals) 621 and 623 and a switching layer (variable resistance layer) 622. The electrode 621 is provided on an upper surface of the interconnect (word line in this case) 51. The switching layer 622 is provided on an upper surface of the electrode 621. The electrode 623 is provided on an upper surface of the switching layer 622. The switching layer 622 is provided between two electrodes 621 and 623 in the Z direction. The material of the switching layer 622 may be, for example, a transition metal oxide, a chalcogenide compound, etc.

The phase change element 60 includes two terminals. The phase change element 60 includes, for example, two electrodes (terminals) 601 and 603 and a phase change layer (compound layer) 602. The electrode 601 is provided on an upper surface of the electrode 623. The phase change layer 602 is provided on an upper surface of the electrode 601. The electrode 603 is provided on an upper surface of the phase change layer 602. An interconnect (bit line in this case) 55 is provided on an upper surface of the electrode 603. The phase change layer 602 is provided between two electrodes 601 and 603 in the Z direction. The material of the phase change layer 602 may be, for example, a chalcogenide compound (e.g., GeSbTe).

The memory cell array 100 may be configured in such a manner that the switching element 62 is provided on the phase change element 60 in the Z direction. Also, the interconnects 51 may be used as bit lines, and the interconnects 55 may be used as word lines.

The state of the phase change layer 602 of the phase change element 60 changes in response to application of heat (e.g., Joule heat) to the phase change layer 602. When the state (phase) of the phase change layer 602 is amorphous, the resistance state of the phase change element 60 becomes high. When the state of the phase change layer 602 is crystalline, the resistance state of the phase change element 60 becomes low. The state in which, for example, the phase change layer 602 of the phase change element 60 is crystalline is referred to as a "set state". The state in which the phase change layer 602 of the phase change element 60 is amorphous is referred to as a "reset state".

A write operation to switch the state of the phase change element 60 from the reset state to the set state is referred to as a "set operation". A write operation to switch the state of the phase change element 60 from the set state to the reset state is referred to as a "reset operation". A pulse shape of a write voltage used in a reset operation (hereinafter referred to as a "reset voltage") is, for example, different from a pulse shape of a write voltage used in a set operation (hereinafter referred to as a "set voltage"). A voltage value of the reset voltage is, for example, higher than a voltage value of the set voltage. A pulse width of the set voltage is, for example, larger than a pulse width of the reset voltage.

In a phase change memory, for example, a relatively high voltage (e.g., of the order of 5V to 10V) is used as a voltage for transfer of a decoded result of an address, activation (selection) of an interconnect, and writing.

A semiconductor device (e.g., a phase change memory) 1 of the present embodiment includes a bus control circuit 20.

The bus control circuit 20 is provided on one or more signal paths in a phase change memory. The bus control circuit 20 is, for example, provided in the row control circuit 110, the column control circuit 120, the I/O circuit 160, and the control circuit 190, and on a signal path between these circuits. The bus control circuit 20 is provided, for example, between the multiplexer 111 and the word line driver 112, between the multiplexer 121 and the bit line driver 122, between the address decoder 192 and the drivers 112 and 122, etc.

Figure 5:
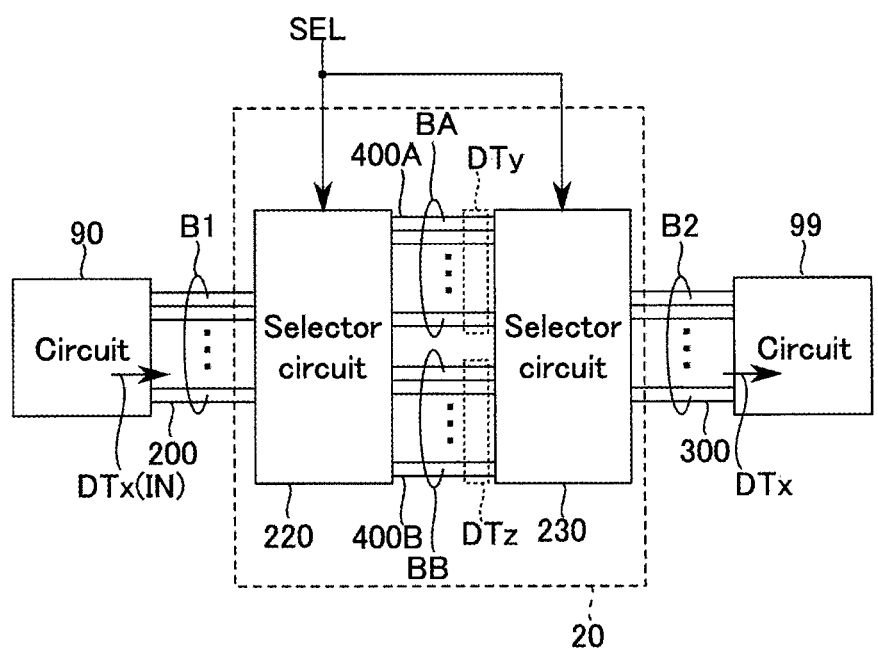
FIG. 5 is a diagram showing a basic configuration of the semiconductor device according to the first embodiment.

FIG. 5 is a schematic diagram showing a basic configuration of a bus control circuit in a semiconductor device according to the present embodiment.

In the semiconductor device (phase change memory in this case) 1, buses B1 and B2 are provided for transfer of data (signals).

The bus B1 is a bus on the input side of data (signals) (hereinafter referred to as an "input-side bus"). The bus B2 is a bus on the output side of data (signals) (hereinafter referred to as an "output-side bus"). The buses B1 and B2 are configured in such a manner that multiple signals can be transmitted in parallel.

The input-side bus B1 includes n signal lines 200. The output-side bus B2 includes n signal lines 300. Here, n is an integer equal to or greater than 1.

The input-side bus B1 is coupled to a circuit 90. The circuit 90 transmits data (n-bit data) DT containing multiple signals IN to the input-side bus B1.

The output-side bus B2 is coupled to a circuit 99. The circuit 99 receives the data DT from the output-side bus B2. The number of signal lines 300 in the output-side bus B2 is the same as the number of signal lines 200 in the input-side bus B1.

The bus control circuit 20 includes two selector circuits 220 and 230 and two buses BA and BB.

The bus BA is coupled between the two selector circuits 220 and 230. The bus BB is coupled between the two selector circuits 220 and 230, in parallel to the bus BA.

The buses BA and BB include signal lines 400A and 400B, respectively. Both the number of the signal lines 400A in the bus BA and the number of the signal lines 400B in the bus BB are the same as the number of signal lines 200 in the input-side bus B1.

The selector circuit 220 is coupled to the input-side bus B1. The selector circuit 230 is coupled to the output-side bus B2.

A control signal (hereinafter also referred to as a "select signal") SEL is supplied to the selector circuits 220 and 230. Based on the control signal SEL, one of the two buses BA and BB is selected. The selected coupling bus is electrically coupled to the input-side bus B1 and the output-side bus B2.

The bus control circuit 20 may include structural elements other than the selector circuits 220 and 230 and the two buses BA and BB. The selector circuits 220 and 230 and the two buses BA and BB may be components provided separately from the bus control circuit 20.

At time tx, n-bit data DTx is supplied to the input-side bus B1.

The coupling bus BA stores n-bit data DTy. Each of the signal lines 400A of the coupling bus BA maintains a signal level of a corresponding 1-bit signal (hereinafter referred to as a "stored signal") of the data DTy as a potential state of the signal line. The data DTy is data transferred between the input-side bus B1 and the output-side bus B2 at time ty prior to time tx.

The coupling bus BB stores n-bit data DTz. Each of the signal lines 400B of the coupling bus BB maintains a signal level of a corresponding 1-bit signal of the data DTz as a potential state of the signal line 400B. The data DTz is data transferred between the input-side bus B1 and the output-side bus B2 at time tz prior to time tx.

In this manner, the coupling buses BA and BB between the selector circuits 220 and 230 store previous data items that have been transferred at mutually different timings.

The data stored in the coupling buses BA and BB (i.e., the potential of the signal lines 400) may be randomly set by the control circuit 190, without depending on the previously transferred data.

The number of signal lines in each coupling bus that store a signal of the same signal level as the signal level of the corresponding bit (1-bit signal) of data to be transferred is counted.

During the transfer of the data DTx, the bus control circuit 20 selects, from the two coupling buses BA and BB which store the previously transferred data, a coupling bus in which a small number of signals constituting the data is inverted (i.e., a small number of the signal lines 400 is charged or discharged), compared to the other coupling bus.

It is thereby possible for the semiconductor device of the present embodiment to reduce the number of times of charging and discharging of the buses (signal lines).

Consequently, it is possible for the semiconductor device of the present embodiment to reduce the power consumption.

<Bus Control Circuit>

Figure 6:
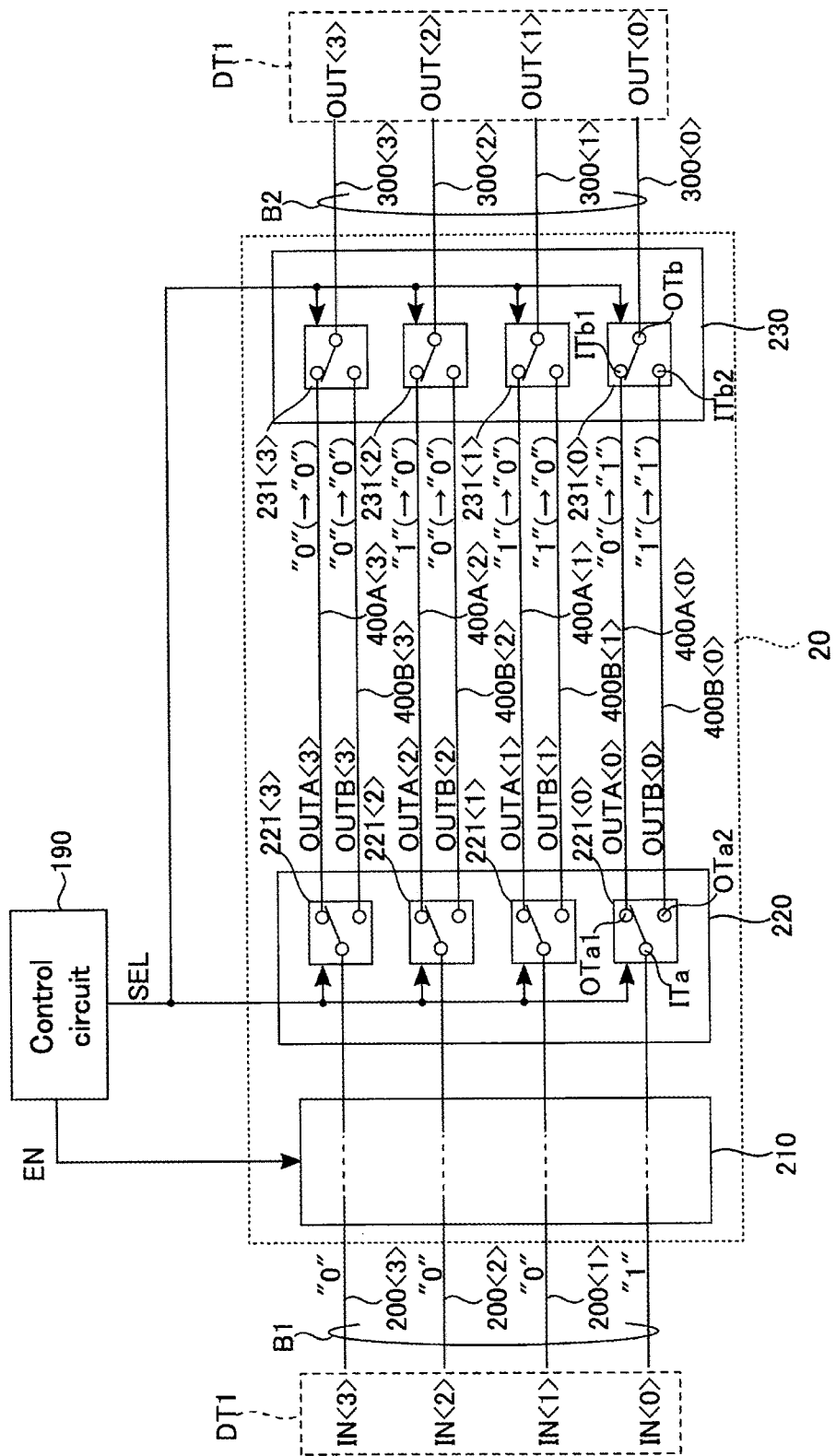
FIG. 6 is a diagram showing a configuration example of the semiconductor device according to the first embodiment.

FIG. 6 is a diagram showing a configuration example of the bus control circuit of the semiconductor device according to the present embodiment.

As shown in FIG. 6, the bus control circuit 20 is coupled between the input-side bus B1 and the output-side bus B2.

Data (hereinafter also referred to as "input data") DT1 is transferred from the input-side bus B1 to the output-side bus B2 via the bus control circuit 20. The data DT1 is a set of n signals IN. During the transfer of the data DT1, multiple 1-bit signals (hereinafter also referred to as "input signals") IN are respectively supplied to the corresponding signal lines 200 in parallel. The data DT1 is, for example, an address signal ADR, a signal indicating a decoded result of the address signal, write data to the memory cell array, and/or read data from the memory cell array.

The input-side bus B1 and the output-side bus B2 include n signal lines 200 and 300, respectively, where n corresponds to the number of bits (n bits) of the data DT1 to be transferred. When the data DT1 is 4-bit data, both the input-side bus B1 and the output-side bus B2 include four signal lines 200 and 300, respectively. The number of the signal lines 200 and 300 in each of the buses B1 and B2 may be equal to or less than 3, and equal to or greater than 5, according to the structure of the buses of the semiconductor device 1.

The bus control circuit 20 includes an enable circuit 210, two selector circuits 220 and 230, and a plurality of coupling buses.

The input-side bus B1 is coupled to the enable circuit 210. The enable circuit 210 controls coupling between the input-side bus B1 and the selector circuit 220 based on a control signal (hereinafter referred to as an "enable signal") EN from the control circuit 190.

During the data transfer, the enable circuit 210 couples the input-side bus B1 to the selector circuit 220, in response to an enable signal EN at an "H" level. During a period other than the data transfer, the enable circuit 210 electrically separates the input-side bus 131 from the selector circuit 220, in response to an enable signal EN at an "L" level.

In this manner, the enable circuit 210 controls the buses B1 and B2 to be activated or inactivated.

One of the selector circuits (hereinafter referred to as an "input-side selector circuit") 220 is coupled to the input-side bus B1 via the enable circuit 210.

The input-side selector circuit 220 includes a plurality of (four in this case) selectors (hereinafter referred to as "input-side selectors") 221. An input terminal ITa of each of the input-side selectors 221 is coupled to a corresponding one of the signal lines 200 of the input-side bus B1. Two output terminals OTa1 and OTa2 of each input-side selector 221 are respectively coupled to the corresponding signal lines 400A and 400B.

Each input-side selector 221 receives a control signal SEL.

The other selector circuit (hereinafter referred to as an "output-side selector circuit") 230 is coupled to a plurality of output-side buses B2.

The output-side selector circuit 230 includes a plurality of (four in this case) selectors (hereinafter referred to as "output-side selectors") 231. Two input terminals ITb1 and ITb2 of the output-side selector 231 are respectively coupled to the corresponding signal lines 400A and 400B. An output terminal OTb of each of the output-side selectors 231 is coupled to a corresponding one of the signal lines 300 of the output-side bus B2.

Each output-side selector 231 receives a control signal SEL.

Two buses (hereinafter referred to as "coupling buses" or "relay buses") BA and BB are coupled between two selector circuits 220 and 230. Both of the coupling buses BA and BB include multiple signal lines 400A and 400B, respectively.

In accordance with the number of the signal lines 200, the number of the signal lines 400A is four in the present example, and the number of the signal lines 400B is four in the present example.

Both of the signal lines 400A and 400B are coupled between the corresponding input-side selector 221 and the corresponding output-side selector 231. The signal lines 400A and the signal lines 400B are arranged in parallel between the two selectors 221 and 231. The signal lines 400A and the signal lines 400B are arranged in an alternating manner in a direction intersecting the direction in which the input-side selector circuit 220 and the output-side selector circuit 230 are aligned.

The number of output terminals of the input-side selector 221 and the number of input terminals of the output-side selector 231 vary according to the number of the signal lines 400A and 400B. In the present example, the number of the output terminals OTa of the input-side selector 221 and the number of the input terminals ITb of the output-side selector 231 are two.

A signal line 400A of one coupling bus BA and a signal line 400B of the other coupling bus BB are coupled to a pair of input-side and output-side selectors 221 and 231.

One end of the signal line 400A is coupled to one output terminal OTa1 of the corresponding input-side selector 221. The other end of the signal line 400A is coupled to one input terminal ITb1 of the corresponding output-side selector 231.

One end of the signal line 400B is coupled to the other output terminal OTa2 of the corresponding input-side selector 221. The other end of the signal line 400B is coupled to the other input terminal ITb2 of the corresponding output-side selector 231.

In accordance with the control signal SEL, one of the paired signal lines 400A and 400B between the selectors 221 and 231 is selected.

When, for example, the signal level of the control signal SEL is at a first level (e.g., "H" level), the selectors 221 and 231 select a signal line 400A of the coupling bus BA. In response thereto, the input-side bus B1 is coupled to the output-side bus B2 via the selected coupling bus BA.

When the signal level of the control signal SEL is a second level (e.g., "L" level) different from the first level, the selectors 221 and 231 select a signal line 400B of the coupling bus BB. Thereby, the input-side bus B1 is coupled to the output-side bus B2 via the selected coupling bus BB.

The signal lines 400A selected by the control signal SEL of the first level belong to a coupling bus (also referred to as, for example, a "first group") BA. The signal lines 400B selected by the control signal SEL of the second level belong to a coupling bus (also referred to as, for example, a "second group") BB.

As described above, the signal lines 400A of the coupling bus BA and the signal lines 400B of the coupling bus BB store data previously transferred between the input-side bus B1 and the output-side bus B2.

Each of the signal lines 400A and 400B is capable of storing 1-bit signals (storage signals) OUTA, OUTB, respectively, constituting the transferred data. Each of the signal lines 400A and 400B maintains the state of the potential corresponding to the transferred data.

The signal lines 400A and 400B are electrically separated from the input-side bus B1 and the output-side bus B2 by the selectors 221 and 231. Thereby, the previously transferred data is stored in the signal lines 400A and 400B, using, for example, the interconnect capacities of the signal lines 400A and 400B.

Alternatively, a register may be provided in the selectors 221 and 231. Also, a value corresponding to the data may be stored in the selectors 221 and 231.

(b) Operation Examples

Operation examples of the memory device according to the present embodiment will be described, with reference to FIGS. 7 and 8.

Figure 7:
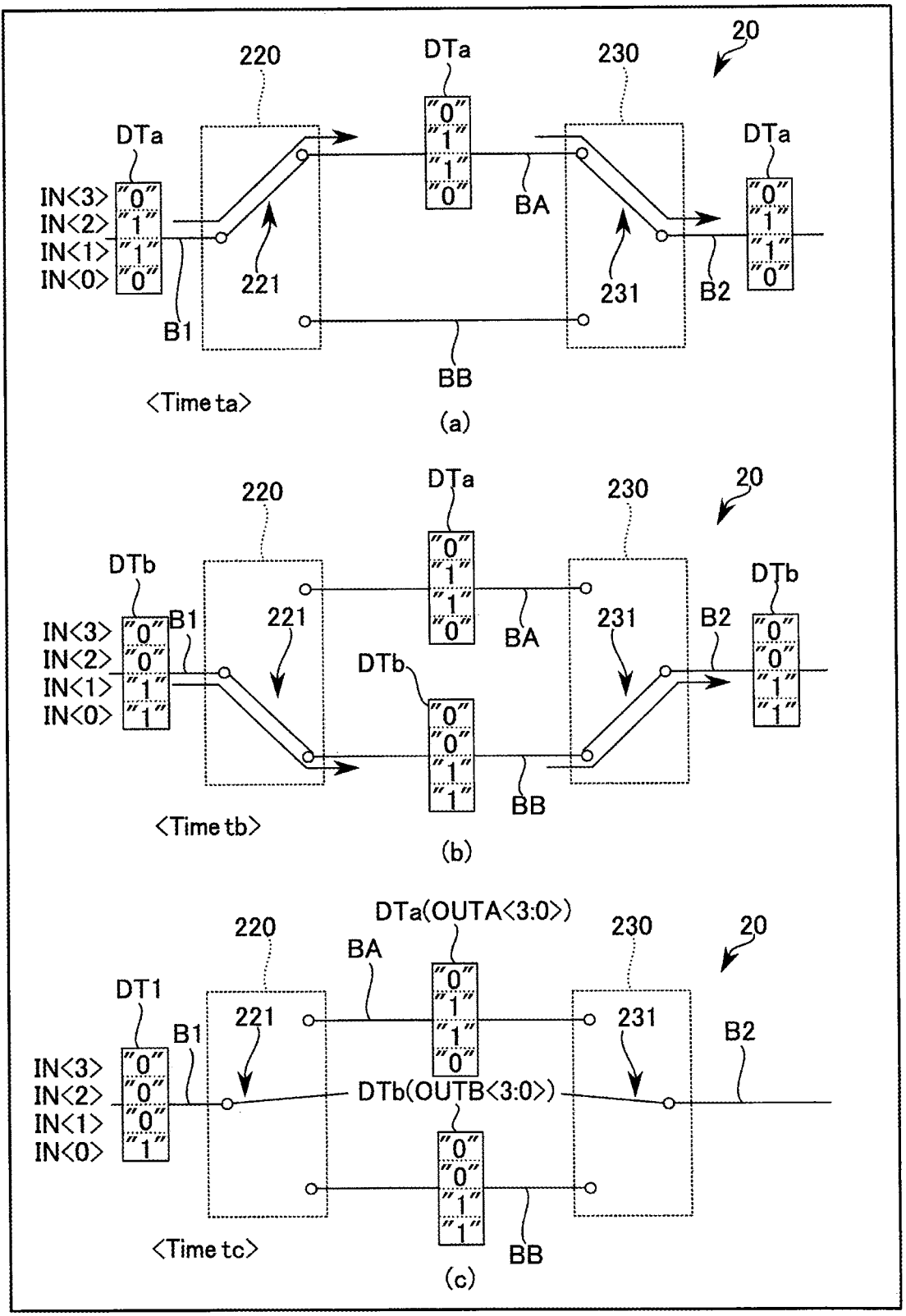
FIGS. 7 and 8 are schematic diagrams showing operation examples of the semiconductor device according to the first embodiment.

FIG. 7 is a schematic diagram illustrating an operation example of the memory device according to the present embodiment.

As shown in FIG. 7(a), n-bit (4-bit in this case) data DTa is supplied from a circuit 90 to the input-side bus B1 at time to earlier than time (current time) tc.

When, for example, the data DTa is not stored in either of the buses BA and BB, data DTa is transferred from the input-side bus B1 to the output-side bus B2 via the bus BA under the control of the control circuit 190 over the selector circuits 220 and 230. Data DTa is supplied from the output-side bus B2 to a circuit 99.

At a timing after the transfer of the data to the output-side bus B2, the coupling bus BA is electrically separated from the input-side bus B1 and the output-side bus B2 under the control of the selector circuits 220 and 230.

Thereby, the data DTa is stored in the coupling bus BA. The signal lines 200A of the coupling bus BA store a signal OUTA.

When, for example, data DTa "0110" is transferred via the coupling bus BA at time ta, as described with reference to FIG. 6, the potentials of the four signal lines 400A<0>, 400A<1>, 400A<2>, and 400A<3> are respectively set to potentials ("L", "H", "H" and "L" in this case) corresponding to the 4-bit signals of the data DTa.

As shown in FIG. 7(b), 4-bit data DT2 is supplied from a circuit 90 to the input-side bus B1 at time tb, which is later than time ta.

When, for example, data is stored in the coupling bus BA but is not stored in the coupling bus BB, data DTb is transferred from the input-side bus B1 to the output-side bus B2 via the coupling bus BB under the control of the control circuit 190 over the selector circuits 220 and 230.

At a timing after the transfer of data DTb to the output-side bus B2, the bus BB is electrically separated from the input-side bus B1 and the output-side bus B2 under the control of the selector circuits 220 and 230.

Thereby, data DTb is stored in the coupling bus BB. The signal lines 200B of the coupling bus BB store a signal OUTB.

When, for example, data DTb "1100" is transferred via the coupling bus BB at time tb, as shown in FIG. 6, the potentials of the four signal lines 400B<0>, 400B<1>, 400B<2>, and 400B<3> are respectively set to the potentials ("H", "H", "L" and "L" in this case) corresponding to the 4-bit signals of the data DTb.

As shown in FIG. 7(c), at time tc, which is later than time to and time tb, 4-bit data DT1 is supplied to the input-side bus B1.

When the data DT1 is transferred from the input-side bus B1 to the output-side bus B2 at time tc, one of the coupling buses BA and BB is selected based on the result of comparison of the supplied data DT1, the data DTa stored in the coupling bus BA, and the data DTb stored in the coupling bus BB.

At time tc, the signal lines 400A in the coupling bus BA are set to either a charged state or a discharged state according to the bit (digit) of the data DTa, and the signal lines 400B in the coupling bus BB are set to either a charged state or a discharged state according to the bit of the data DTb.

The control circuit 190 compares a bit of data DT1 (a digit of the data) and the potential states of the signal lines 400A and 400B corresponding to the bit.

The control circuit 190 determines, for example, whether or not a signal OUTA stored in the signal line 400A (a potential state of the signal line 400A) is the same as the signal level (potential) of the corresponding bit of the data DT1. Similarly, the control circuit 190 determines whether or not a signal OUTB stored in the signal line 400B (a potential state of the signal line 400B) is the same as the signal level of the corresponding bit of the data DT1.

With respect to the coupling bus BA, the control circuit 190 counts the number of signal lines 400A in a potential state equivalent to the signal level of the corresponding bit of the data DT1. The control circuit 190 acquires, for example, the number of the signal lines 400A in a potential state equivalent to the signal level of the corresponding bit of the data DT1 in the coupling bus BA, as a first count C1.

With respect to the coupling bus BB, the control circuit 190 counts the number of signal lines 400B in a potential state equivalent to the signal level of the corresponding bit of the data DT1. The control circuit 190 acquires, for example, the number of signal lines 400B in a potential state equivalent to the signal level of the corresponding bit of the data DT1 in the coupling bus BB, as a second count C2.

In the example of FIG. 6, the potential states (storage signals OUTA) of the signal lines 400A of the coupling bus BA are configured in such a manner that the storage signal OUTA<0> is "0" ("L"), the storage signal OUTA<1> is "1" ("H"), the storage signal OUTA<2> is "1" ("H"), and the storage signal OUTA<3> is "0" ("L").

The potential states (storage signals OUTB) of the signal lines 400B of the coupling bus BB are configured in such a manner that the storage signal OUTB<0> is "1" ("H"), the storage signal OUTB<1> is "1" ("H"), the storage signal OUTB<2> is "0" ("L"), and the storage signal OUTB<3> is "0" ("L").

With respect to the signal lines 400A in the coupling bus BA, the number (count) C1 of the storage signals OUTA at a signal level equivalent to the signal level of the corresponding input signal IN is "1". In this case, when data DT1 "1000" is transferred, the number of signal lines 400A in which charging or discharging occurs (the number of occurrences of data inversion) in the coupling bus BA is three.

With respect to the signal lines 400B in the coupling bus BB, the number (count) C2 of the storage signals OUTB at a signal level equivalent to the signal level of the corresponding input signal IN is "3". When data DT1 "1000" is transferred, the number of signal lines 400B in which charging or discharging occurs in the coupling bus BB is one.

The number of storage signals that are inverted with respect to the input signal IN (signal lines in which charging/discharging occurs) may be counted for each of the coupling buses BA and BB.

The control circuit 190 selects one of the coupling bus BA and BB which includes, compared to the other coupling bus, a large number of signal lines that are in a potential state equivalent to the signal level of the corresponding bit of the transfer data DT1, in such a manner that the selected coupling bus is used for data transfer.

Based on the result of comparison of the data DT1, the data DTa of the coupling bus BA, and the storage data DTb of the coupling bus BB, the control circuit 190 determines the signal level of the control signal SEL. The control circuit 190 compares a magnitude relationship between the count C1 relating to the coupling bus BA and the count C2 relating to the coupling bus BB.

The control circuit 190 supplies a control signal SEL including the determined signal level ("H" or "L" level) to the bus control circuit 20.

During the transfer of the data DT1 in FIG. 6, it is desirable, from the viewpoint of suppressing power consumption, that the coupling bus BB be selected, rather than the coupling bus BA, as a signal path for data transfer between the input-side bus B1 and the output-side bus B2.

Accordingly, the control circuit 190 supplies, for example, a control signal SEL at an "L" level to the selectors 221 and 231.

The control signal SEL is supplied to the selector circuits 220 and 230 of the bus control circuit 20. Each of the selectors 221 and 231 receives the supplied control signal SEL. The selectors 221 and 231 electrically couple one of the two coupling buses BA and BB to the input-side bus B1 and the output-side bus B2, based on the control signal SEL.

Thereby, the input-side bus B1 is electrically coupled to the output-side bus B2 via the selected coupling bus.

In the present example, the signal lines 400B of the coupling bus BB are coupled to the corresponding signal lines 200 and 300 via the selectors 221 and 231.

Figure 8:
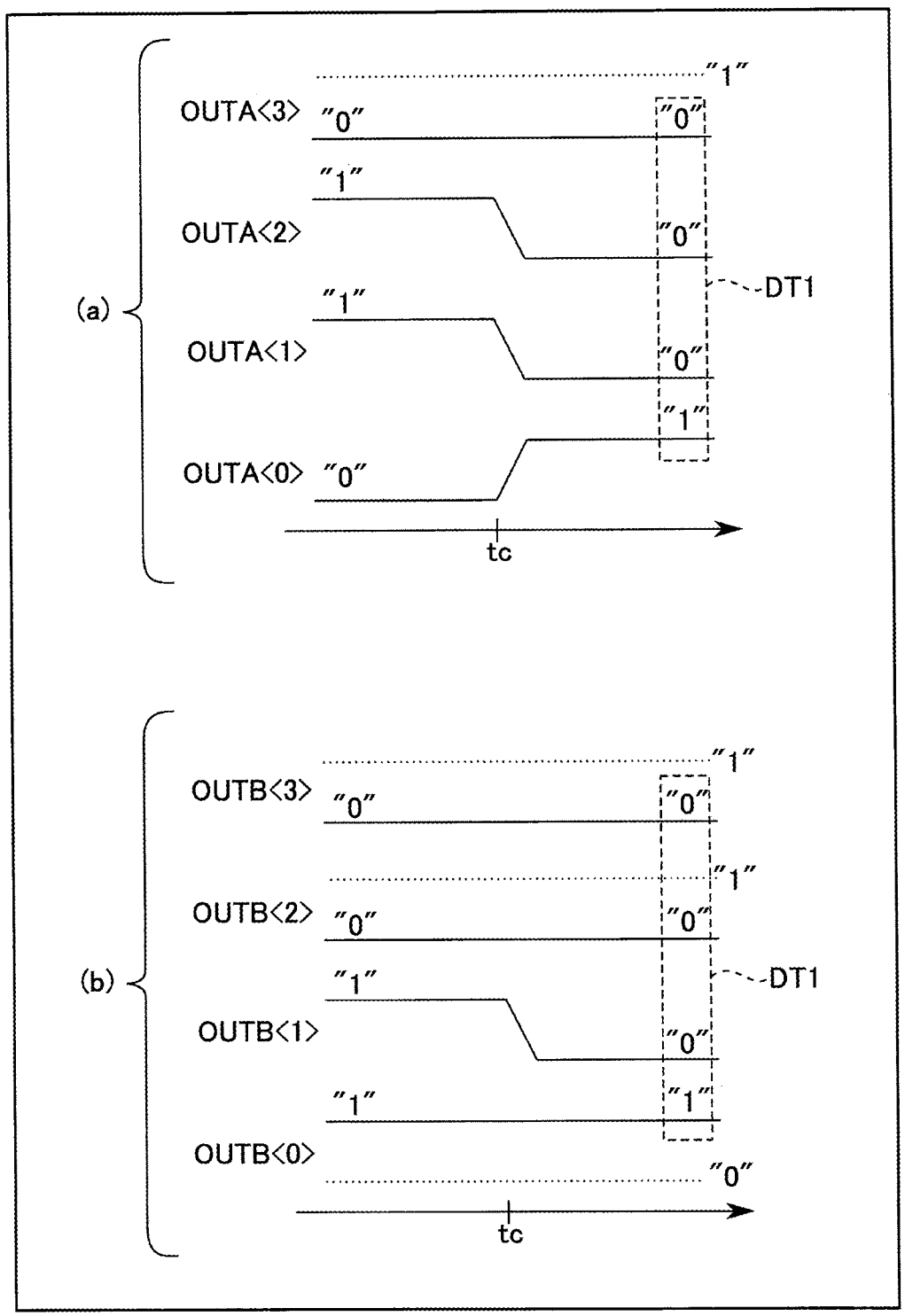

FIG. 8 is a timing chart showing a transition of the signal level of the signal lines during data transfer. As shown in FIG. 8(a), for example, when first data DT1 is transferred using a coupling bus BA, charging of a signal line OUTA<0> and discharging of signal lines OUTA<1> and OUTA<2> occur.

As shown in FIG. 8(b), when first data DT1 is transferred using a coupling bus BB, discharging of a signal line OUTB<1> occurs.

In this manner, one of the coupling buses BA and BB (a coupling bus BB in this case) which includes a small number of signal lines 400 that are charged or discharged for the transfer of the data DT1, compared to the other coupling bus, is selected.

The signal lines of the non-selected coupling bus (e.g., signal lines 400A of the coupling bus BA) are electrically separated from the signal lines 200 and 300 by the selectors 221 and 231.

Accordingly, the non-selected signal lines 400A are arranged in an electrically floating state between the signal lines 400B to which the input signal IN is supplied. Thereby, the non-selected signal lines 400A function as a shield between the selected signal lines 400B.

Consequently, it is possible for the semiconductor device of the present embodiment to improve the characteristics for data transfer, such as reduction of noise in the signal lines. When the signal lines 400A are used for data transfer, the signal lines 400B function as a shield against the selected signal lines 400A.

By the transfer of the data DT1, the coupling bus BB used for transfer of the data DT1 transitions from the state of storing data DTb ("1100") to the state of storing data DT1 ("1000"). The potential state of each of the signal lines 400B is set to a state corresponding to the signal level of the signal IN of the data DT1.

After time tc, the supplied data is transferred from the input-side bus B1 to the output-side bus B2 by repetition of the operation in FIG. 7(c).

In the above-described manner, data transfer in the semiconductor device according to the present embodiment is completed.

(c) Conclusion

In a semiconductor device that operates using a relatively high voltage, such as a phase change memory, a large current is generated by charging or discharging of a relatively high voltage in the signal lines.

In this case, the power consumption of the semiconductor device increases.

The semiconductor device of the present embodiment includes multiple coupling buses coupled in parallel, on a path of data transfer. Each of the coupling buses stores the transferred data. Each of the signal lines of the coupling bus are set to a charged or discharged state according to the signal contained in the transferred data.

The semiconductor device of the present embodiment transfers the supplied data using one of a plurality of coupling buses coupled in parallel in which a small number of data items (signals) is inverted with respect to the supplied data, compared to the other coupling buses.

During data transfer, for example, the input signal (1-bit data) of data supplied to the input-side bus is compared with the storage signals of the signal lines (charged/discharged states of the signal lines) in each coupling bus.

In the present embodiment, a coupling bus is selected, from multiple coupling buses, in which a large number of storage signals of signal lines have the same signal level (potential state) as the signal level of the corresponding input signals, compared to the other coupling buses.

It is thereby possible for the semiconductor device of the present embodiment to reduce the number of signal lines that are charged or discharged during data transfer.

Accordingly, it is possible for the semiconductor device of the present embodiment to suppress an increase in the power consumption.

In the semiconductor device of the present embodiment, the signal lines of a coupling bus that is not selected as a path for data transfer function as a shield against the signal lines of the selected coupling bus. It is thereby possible for the semiconductor device of the present embodiment to reduce the noise of the signal lines during the data transfer.

As described above, it is possible for the semiconductor device of the present embodiment to improve its characteristics.

(2) Second Embodiment

A semiconductor device according to a second embodiment will be described, with reference to FIGS. 9 and 10.

Figure 9:
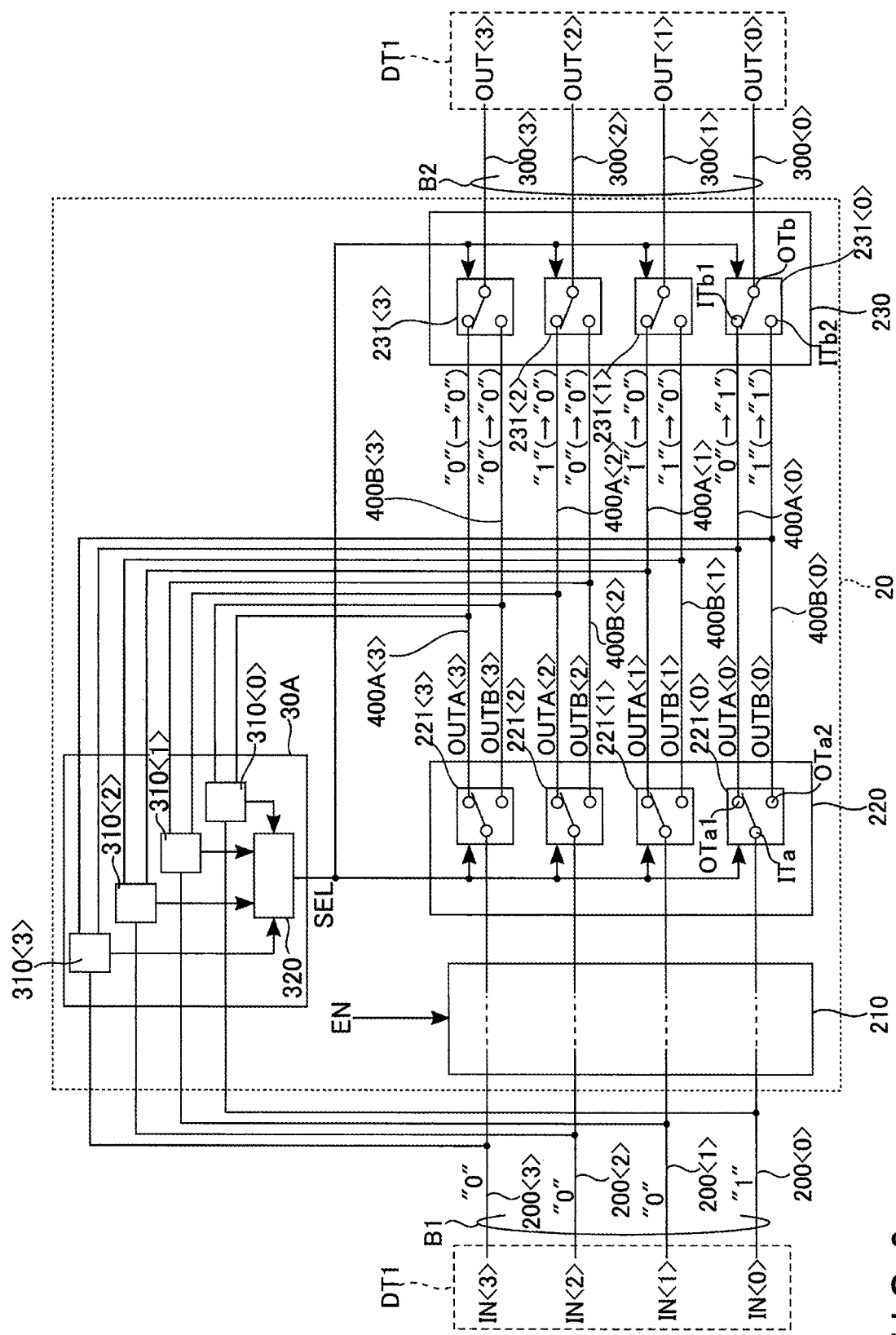
FIGS. 9 and 10 are diagrams showing configuration examples of a semiconductor device according to a second embodiment.

FIG. 9 is a schematic diagram illustrating a configuration example of the semiconductor device according to the present embodiment.

In FIG. 9, a bus control circuit in the semiconductor device of the present embodiment is shown.

As shown in FIG. 9, the bus control circuit 20 of the semiconductor device (e.g., a phase change memory) of the present embodiment includes a determination circuit 30A.

The determination circuit 30A determines a signal level of the control signal SEL using the data DT to be transferred and the data (potential states of the signal lines 400A and 400B) stored in the coupling buses 400A and 400B.

The determination circuit 30A is coupled to the input-side bus B1 and the interconnects 400A and 400B in the coupling buses BA and BB.

The determination circuit 30A includes a plurality of determination units 310 and a calculation circuit 320.

The number of determination units 310 corresponds to the number of signal lines 200 of the input-side bus B1 (the number of bits of data to be transferred). When, for example, the number of the signal lines 200 is four (when the data to be transferred is 4-bit data), four determination units 310 are provided in the determination circuit 30A.

Each determination unit 310 is coupled to a corresponding one of the signal lines 200. The determination units 310 are coupled to different signal lines 200.

Each determination unit 310 is coupled to a corresponding one of the signal lines 400A of the coupling bus BA and a corresponding one of the signal lines 400B of the coupling bus BB.

Each determination unit 310 determines whether or not the signal level of the 1-bit data (signal) of the corresponding signal line 200 matches the potential state of the corresponding signal line 400A and the potential state of the corresponding signal line 400B.

Each determination unit 310 supplies results of determination to the calculation circuit 320.

Based on the results of determination, the calculation circuit 320 determines the signal level of the control signal SEL.

Through a calculation process by a calculation circuit 320, one of the first coupling bus BA and the second coupling bus BB which includes a large number of signal lines 400 that store storage signals OUTA and OUTB at a signal level equivalent to the signal level of the supplied input signal IN, compared to the other coupling bus, is detected and selected.

Thereby, one of the first coupling bus BA and the second coupling bus BB is selected as a transfer path of the data DT1.

The determination circuit 30A may be a component separate from the bus control circuit 20. The determination circuit 30A may be, for example, a circuit provided in the control circuit 190.

Figure 10:
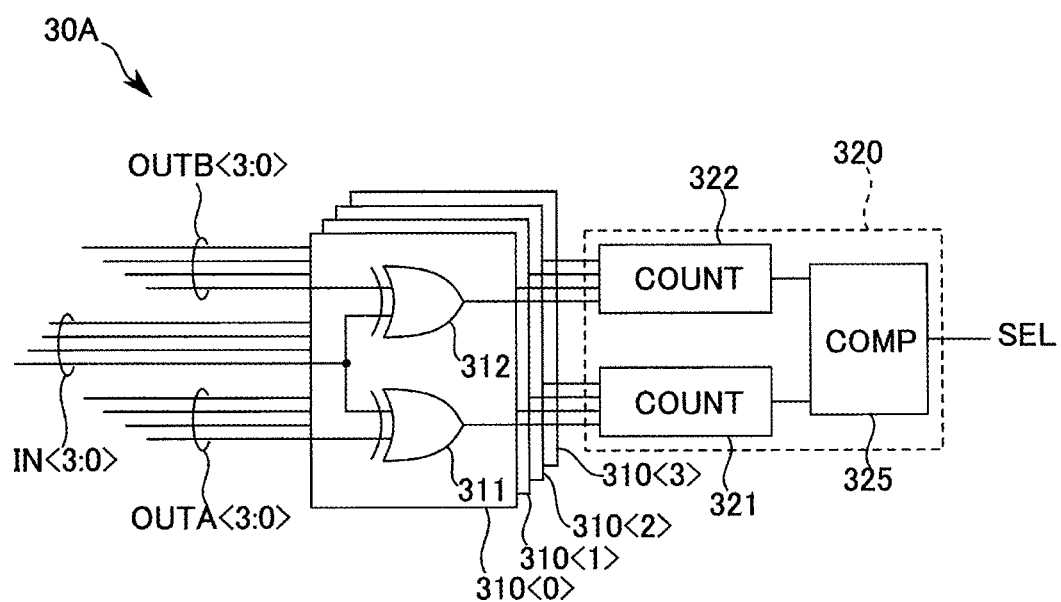

FIG. 10 is a schematic diagram showing an example of a determination circuit in a semiconductor device according to the present embodiment.

As shown in FIG. 10, the determination circuit 30A includes a plurality of determination units 310 corresponding to the number of the signal lines 200 of the input-side bus B1 (the number of bits of data to be transferred).

Each determination unit 310 includes a plurality of XOR gates 311 and 312. The number of XOR gates 311 and 312 in the determination unit 310 corresponds to the number of the coupling buses BA and BB.

When, for example, the number of coupling buses BA and BB is two, each determination unit 310 includes two XOR gates 311 and 312.

One input terminal of one XOR gate 311 is coupled to a corresponding signal line 200 of the input-side bus B1. The other input terminal of the one XOR gate 311 is coupled to a corresponding signal line 400A of the coupling bus BA.

The XOR gate 311 performs an XOR computation of the input signal IN and the storage signal OUTA (potential of the signal line 400A).

The XOR gate 311 outputs "0" when the value of the input signal IN is the same as the value of the storage signal OUTA. When the value of the input signal IN is different from the value of the storage signal OUTA, the XOR gate 311 outputs "1".

One input terminal of the other XOR gate 312 is coupled to a corresponding signal line 200. The other input terminal of the other XOR gate 312 is coupled to a corresponding signal line 400B of the coupling bus BB.

The XOR gate 312 performs an XOR computation of the input signal IN and the storage signal OUTB (potential of the signal line 400B).

The XOR gate 312 outputs "0" when the value of the input signal IN is the same as the value of the storage signal OUTB. When the value of the input signal IN is different from the value of the storage signal OUTB, the XOR gate 312 outputs "1".

Each determination unit 310 transmits a result of the XOR computation to the calculation circuit 320.

In this manner, each determination unit 310 determines whether or not the 1-bit signal IN from the corresponding signal line 200 matches the signal (potential) of the corresponding signal line 400A and the signal (potential) of the corresponding signal line 400B.

The calculation circuit 320 includes count circuits 321 and 322 and a comparison circuit 325.

The count circuits 321 and 322 are coupled to the determination unit 310.

The count circuit 321 receives a result of determination of the input signal IN and the storage signal OUTA. 4-bit data, for example, is supplied to the count circuit 321 as a result of determination relating to the coupling bus BA. The count circuit 321 counts, for example, the number of "1"'s (or "0"'s) contained in the data (result of determination). The count circuit 321 transmits a value corresponding to the result of counting to the comparison circuit 325.

The count circuit 322 receives a result of determination of the input signal IN and the storage signal OUTB. 4-bit data, for example, is supplied to the count circuit 321 as a result of determination relating to the coupling bus BB. The count circuit 322 counts, for example, the number of "1"'s (or "0"'s) contained in the data (result of determination). The count circuit 322 transmits a value corresponding to the result of counting to the comparison circuit 325.

The comparison circuit 325 compares the values of the results of counting from the count circuits 321 and 322. When the value from the count circuit 321 is equal to or less than the value from the count circuit 322, the comparison circuit 325 sets, for example, the signal level of the control signal SEL to "H(1)". Thereby, the coupling bus BA is selected as a transfer path of the data DT1.

When the value from the count circuit 321 is greater than the value from the count circuit 322, the comparison circuit 325 sets the signal level of the control signal SEL to "L(0)". Thereby, the coupling bus BB is selected as a transfer path of the data DT1.

When the result of counting from the count circuit 321 is the same as the result of counting from the count circuit 322, the coupling bus BB may be selected as a transfer path of the data DT1.

In the semiconductor device of the present embodiment, the determination circuit operates in the above-described manner.

In this manner, the semiconductor device of the present embodiment selects a data transfer path in which a small number of times of charging and discharging occurs, through a calculation process of the input signal and the storage signal.

Accordingly, the semiconductor device of the second embodiment is capable of achieving substantially the same advantageous effect as the semiconductor device of the first embodiment.

(3) Third Embodiment

A semiconductor device according to a third embodiment will be described, with reference to FIGS. 11 and 12.

Figure 11:
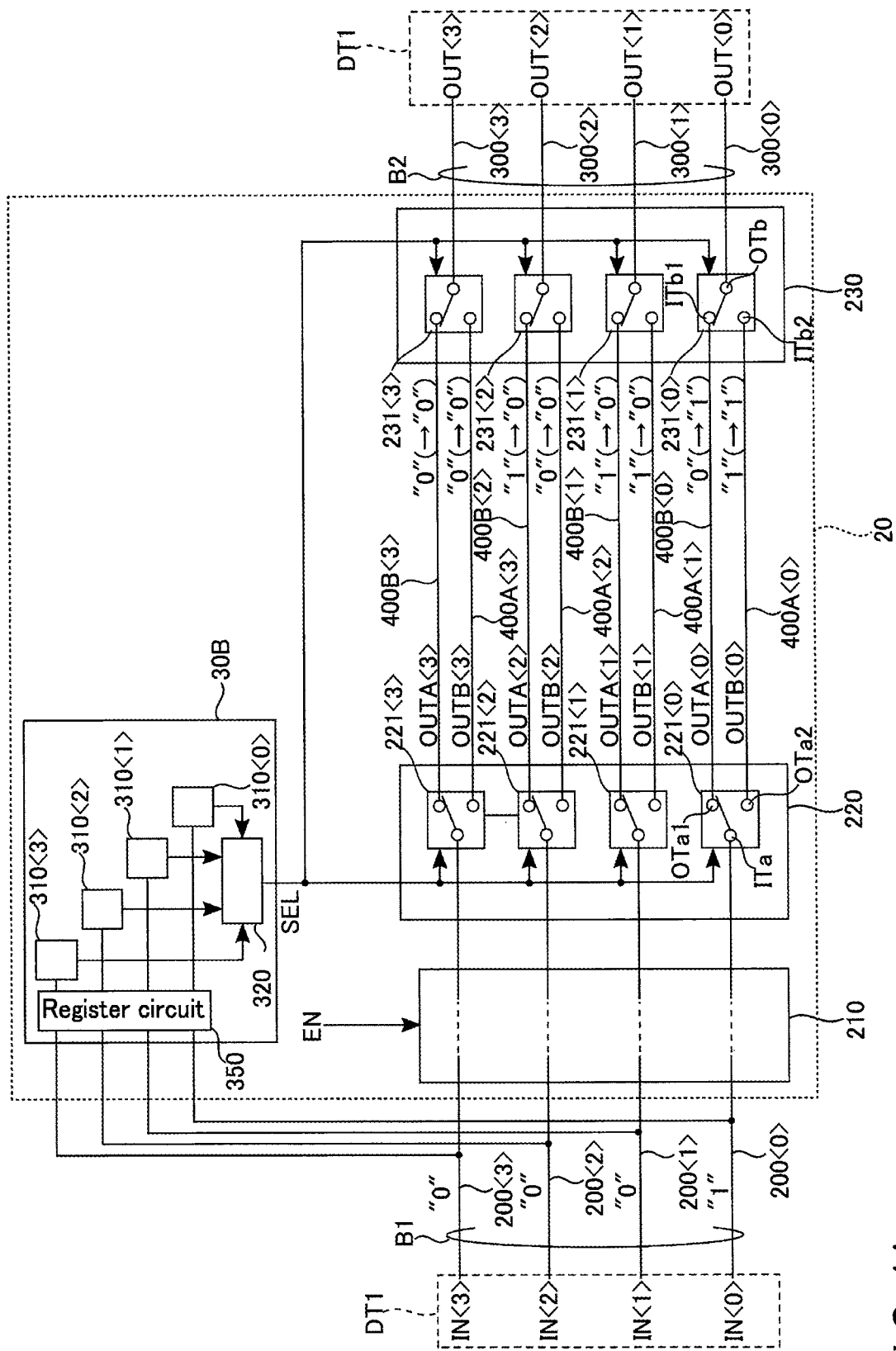

FIG. 11 is a schematic diagram illustrating a configuration example of the semiconductor device according to the present embodiment. In FIG. 11, a configuration example of a bus control circuit in the semiconductor device according to the present embodiment is shown.

The present embodiment is different from the second embodiment mainly in an internal configuration of the determination circuit 30B.

The determination circuit 30B includes a plurality of register circuits 350.

The register circuits 350 respectively correspond to the signal lines 200 of the input-side bus B1. Each register circuit 350 is coupled to the determination unit 310.

Each register circuit 350 stores data supplied prior to the current time.

Each determination unit 310 performs a determination process using data (a previous input signal) in the register circuit 350 and data (a current input signal) from the input-side bus B1.

The calculation circuit 320 performs a calculation process using the result of determination of each determination unit 310. Based on the result of the calculation process, the signal level of the control signal SEL is determined.

The determination circuit 30B may be a component separate from the bus control circuit 20. The determination circuit 30B may be, for example, a circuit provided in the control circuit 190.

FIG. 12 is a schematic diagram showing an example of a determination circuit in a semiconductor device according to the present embodiment.

As shown in FIG. 12, the register circuit 350 is coupled to the input-side bus B1 and the determination unit 310.

The register circuit 350 includes two register units 351 and 352. The register units 351 and 352 store data (hereinafter also referred to as "register data") REGA and REGB, respectively. The data REGA and REGB are data (signals) supplied from the input-side bus B1 at mutually different timings during the past transfer of data (e.g. data transferred prior to time tc). Similarly to the data DT (e.g., data transferred at time tc) to be transferred, the data REGA and REGB are n-bit (4-bit in this case) data.

The register unit 351 is coupled to one input terminal of the each XOR gate 311. The register unit 351 supplies a corresponding one of the signals (1-bit data) contained in the data REGA to a corresponding one of the XOR gates 311. The other input terminal of the XOR gate 311 is coupled to a corresponding signal line 200 of the input-side bus B1.

The XOR gate 311 performs an XOR computation of the signal from the register unit 351 and the signal IN from the signal line 200.

The register unit 352 is coupled to one input terminal of the each XOR gate 312. The register unit 352 supplies a corresponding one of the signals (1-bit data) contained in the data REGB to a corresponding one of the XOR gates 312. The other input terminal of the XOR gate 312 is coupled to a corresponding signal line 200 of the input-side bus B1.

The XOR gate 312 performs an XOR computation of the signal from the register unit 352 and the signal IN from the signal line 200.

The count circuits 321 and 322 perform a count process on the result of computation from the corresponding XOR gates 311 and 312, in a manner substantially similar to the second embodiment.

The comparison circuit 325 determines a signal level of the control signal SEL based on a result of counting from the count circuits 321 and 322, in a manner substantially similar to the second embodiment.

Based on the signal level of the control signal SEL, either the coupling bus BA (signal lines 400A) or the coupling bus BB (signal lines 400B) is selected.

The determined control signal SEL is supplied to the selector circuits 220 and 230, and supplied to the register circuit 350.

The register units 351 and 352 capture the supplied data DT1 according to the signal level of the select signal SEL.

When, for example, the signal level of the control signal SEL is at an "H" level, since the potential state of the signal lines 400A changes to the state corresponding to the data DT1 through selection of the coupling bus BA, the register unit 351 stores the data DT1 (input signal IN). At this time, the register unit 352 maintains the stored data.

When, for example, the signal level of the control signal SEL is at an "L" level, since the potential state of the signal lines 400B changes to the state corresponding to the data DT1 through selection of the coupling bus BB, the register unit 352 stores the data DT1 (input signal IN). At this time, the register unit 351 maintains the stored data.

In the semiconductor device of the present embodiment, the determination circuit including the register circuit operates in the above-described manner.

In this manner, the semiconductor device of the present embodiment selects a data transfer path in which a small number of times of charging and discharging occurs, through a calculation process using data in the register circuit.

Accordingly, the semiconductor device of the third embodiment is capable of achieving substantially the same advantageous effect as that of the semiconductor device of the first or second embodiment.

(4) Others

In the present embodiment, a memory device (e.g., a phase change memory) is shown as an example of the semiconductor device. However, the semiconductor device of the present embodiment may be a processor, a controller, a sensing device, etc. The semiconductor device of the present embodiment may be a memory device other than a phase change memory, such as a NAND-type flash memory, a magnetoresistive memory (e.g., an MRAM), and a resistance change memory (e.g., ReRAM).

In the present embodiment, a bus control circuit is shown as a circuit in a semiconductor device. However, the bus control circuit of the present embodiment may be applied to a bus that couples two different devices. For example, the bus control circuit of the present embodiment may be provided in a bus that couples an interface of one of the devices and an interface of the other device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    first signal lines that transmit first signals;
    second signal lines that receive the first signals; and
    a first circuit including a first selector circuit, a second selector circuit, third signal lines, and fourth signal lines, the first selector circuit being coupled to the first signal lines, the second selector circuit being coupled to the second signal lines, the third signal lines being coupled between the first and second selector circuits, and the fourth signal lines being coupled between the first and second selector circuits, wherein
    each of the third signal lines stores a corresponding one of the second signals, and
    each of the fourth signal lines stores a corresponding one of the third signals,
    the first circuit is configured to:
        count a first number of second signals equivalent to corresponding first signal of the first signals, with respect to the first and third signal lines;
        count a second number of third signals equivalent to the corresponding first signal, with respect to the first and fourth signal lines; and
        electrically couple either the third signal lines or the fourth signal lines to the first and second signal lines via the first and second selector circuits, based on a result of comparison between the first number and the second number.

2. The semiconductor device according to claim 1, wherein
    the third signal lines and the fourth signal lines are coupled in parallel between the first selector circuit and the second selector circuit, and
    one of the third signal lines and one of the fourth signal lines are adjacent to each other.

3. The semiconductor device according to claim 1, wherein
    the first selector circuit includes first selectors, and the second selector circuit includes second selectors,
    a first input terminal of each of the first selectors is coupled to a corresponding one of the first signal lines,
    a first output terminal of each of the first selectors is coupled to a corresponding one of the third signal lines,
    a second output terminal of each of the first selectors is coupled to a corresponding one of the fourth signal lines,
    a first input terminal of each of the second selectors is coupled to a corresponding one of the third signal lines,
    a second input terminal of each of the second selectors is coupled to a corresponding one of the fourth signal lines, and
    a first output terminal of each of the second selectors is coupled to a corresponding one of the second signal lines.

4. The semiconductor device according to claim 1, wherein
    the first circuit further includes:
        a second circuit coupled to the first signal lines, the third signal lines, and the fourth signal lines, and configured to supply a control signal to the first and second selector circuits, wherein
    the second circuit acquires the first number and the second number based on a logic computation of the first, second, and third signals, and controls a signal level of the control signal based on a result of comparison between the first number and the second number.

5. The semiconductor device according to claim 4, wherein
    the first and second selector circuits select either the third signal lines or the fourth signal lines based on the control signal.

6. The semiconductor device according to claim 1, wherein
    the first circuit further includes:
        a second circuit including a register circuit that stores the second and third signals, coupled to the first signal lines, and configured to supply a control signal to the first and second selector circuits,
    the second circuit acquires the first number and the second number based on a logic computation of the first, second, and third signals, and controls a signal level of the control signal based on a result of comparison between the first number and the second number.

7. The semiconductor device according to claim 6, wherein
the first and second selector circuits select either the third signal lines or the fourth signal lines based on the control signal.

8. The semiconductor device according to claim 1, wherein
the second signals are signals transmitted from the first signal lines to the second signal lines via the third signal lines prior to the first signals, and
the third signals are signals transmitted from the first signal lines to the second signal lines via the fourth signal lines prior to the first signals.

9. The semiconductor device according to claim 1, wherein
when the first number is larger than the second number, the first selector circuit couples the first signal lines to the third signal lines, and the second selector circuit couples the second signal lines to the third signal lines, and
when the first number is smaller than the second number, the first selector circuit couples the first signal lines to the fourth signal lines, and the second selector circuit couples the second signal lines to the fourth signal lines, and
when the first number is equal to the second number, the first selector circuit couples the first signal lines to a selected one of the third signal lines and the fourth signal lines, and the second selector circuit couples the second signal lines to the selected one.

10. The semiconductor device according to claim 1, further comprising:
a memory cell including a phase change element.

11. A memory device comprising:
first signal lines that transmit first signals;
second signal lines that receive the first signals;
a memory cell array including a memory cell, the memory cell array coupled to one of the first signal lines and the second signal lines; and
a first circuit including a first selector circuit, a second selector circuit, third signal lines, and fourth signal lines, the first selector circuit being coupled to the first signal lines, the second selector circuit being coupled to the second signal lines, the third signal lines being coupled between the first and second selector circuits, and the fourth signal lines being coupled between the first and second selector circuits, wherein
each of the third signal lines stores a corresponding one of the second signals, and
each of the fourth signal lines stores a corresponding one of the third signals,
the first circuit is configured to:
count a first number of second signals equivalent to corresponding first signal of the first signals, with respect to the first and third signal lines,
count a second number of third signals equivalent to the corresponding first signal, with respect to the first and fourth signal lines, and
electrically couple either the third signal lines or the fourth signal lines to the first and second signal lines via the first and second selector circuits, based on a result of comparison between the first number and the second number.

12. The memory device according to claim 11, wherein
the third signal lines and the fourth signal lines are coupled in parallel between the first selector circuit and the second selector circuit, and one of the third signal lines and one of the fourth signal lines are adjacent to each other.

13. The memory device according to claim 11, wherein
the first selector circuit includes first selectors, and the second selector circuit includes second selectors,
a first input terminal of each of the first selectors is coupled to a corresponding one of the first signal lines,
a first output terminal of each of the first selectors is coupled to a corresponding one of the third signal lines,
a second output terminal of each of the first selectors is coupled to a corresponding one of the fourth signal lines,
a first input terminal of each of the second selectors is coupled to a corresponding one of the third signal lines,
a second input terminal of each of the second selectors is coupled to a corresponding one of the fourth signal lines, and
a first output terminal of each of the second selectors is coupled to a corresponding one of the second signal lines.

14. The memory device according to claim 11, wherein
the first circuit further includes:
a second circuit coupled to the first signal lines, the third signal lines, and the fourth signal lines, and configured to supply a control signal to the first and second selector circuits, wherein
the second circuit acquires the first number and the second number based on a logic computation of the first, second, and third signals, and controls a signal level of the control signal based on a result of comparison between the first number and the second number.

15. The memory device according to claim 14, wherein
the first and second selector circuits select either the third signal lines or the fourth signal lines based on the control signal.

16. The memory device according to claim 11, wherein
the first circuit further includes:
a second circuit including a register circuit that stores the second and third signals, coupled to the first signal lines, and configured to supply a control signal to the first and second selector circuits,
the second circuit acquires the first number and the second number based on a logic computation of the first, second, and third signals, and controls a signal level of the control signal based on a result of comparison between the first number and the second number.

17. The memory device according to claim 16, wherein
the first and second selector circuits select either the third signal lines or the fourth signal lines based on the control signal.

18. The memory device according to claim 11, wherein
the second signals are signals transmitted from the first signal lines to the second signal lines via the third signal lines prior to the first signals, and
the third signals are signals transmitted from the first signal lines to the second signal lines via the fourth signal lines prior to the first signals.

19. The memory device according to claim 11, wherein
when the first number is larger than the second number, the first selector circuit couples the first signal lines to the third signal lines, and the second selector circuit couples the second signal lines to the third signal lines, and
when the first number is smaller than the second number, the first selector circuit couples the first signal lines to the fourth signal lines, and the second selector circuit couples the second signal lines to the fourth signal lines, and
when the first number is equal to the second number, the first selector circuit couples the first signal lines to a selected one of the third signal lines and the fourth signal lines, and the second selector circuit couples the second signal lines to the selected one.

20. The memory device according to claim 11, wherein the memory cell includes a phase change element.

\* \* \* \* \*